United States Patent
Hashimoto et al.

(10) Patent No.: US 6,811,634 B2
(45) Date of Patent: Nov. 2, 2004

(54) METHOD FOR MANUFACTURING CERAMIC MULTI-LAYERED BOARD

(75) Inventors: Akira Hashimoto, Uji (JP); Keiichi Nakao, Hirakata (JP); Masaaki Katsumata, Hirakata (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/332,962

(22) PCT Filed: May 21, 2002

(86) PCT No.: PCT/JP02/04916

§ 371 (c)(1),
(2), (4) Date: Feb. 11, 2003

(87) PCT Pub. No.: WO02/096172

PCT Pub. Date: Nov. 28, 2002

(65) Prior Publication Data

US 2003/0183318 A1 Oct. 2, 2003

(30) Foreign Application Priority Data

May 24, 2001 (JP) .......................................... 2001-154958

(51) Int. Cl.[7] .......................... B32B 31/26; C04B 37/00; H05K 3/46
(52) U.S. Cl. ................................ 156/89.12; 156/89.16; 156/89.23
(58) Field of Search ........................... 156/89.12, 89.16, 156/89.23; 264/614, 618, 619

(56) References Cited

U.S. PATENT DOCUMENTS

| | | | | |
|---|---|---|---|---|
| 4,799,984 A | * | 1/1989 | Rellick | 156/89.12 |
| 4,806,188 A | | 2/1989 | Rellick | |
| 5,006,182 A | * | 4/1991 | Gantzhorn et al. | 156/89.16 |
| 5,300,163 A | * | 4/1994 | Ohtaki | 156/89.15 |
| 5,609,704 A | * | 3/1997 | Hayama et al. | 156/89.16 |

FOREIGN PATENT DOCUMENTS

| | | | |
|---|---|---|---|
| EP | 0 405 947 | * | 1/1991 |
| JP | 5-238853 | * | 9/1993 |
| JP | 11-121645 | * | 4/1999 |
| JP | 11-135946 | | 5/1999 |
| JP | 11-220260 | | 8/1999 |
| JP | 2000-183503 | * | 6/2000 |
| JP | 2001-15916 | | 1/2001 |

* cited by examiner

*Primary Examiner*—Melvin C. Mayes
(74) *Attorney, Agent, or Firm*—Parkhurst & Wendel, L.L.P.

(57) ABSTRACT

A manufacturing method of ceramic multi-layer boards including a step of forming adhesive layer (12) on ceramic board (11), and adhesive layer (12) integrates board 11 and ceramic green sheet 14. Little shrinkage in an in-plane direction is observed after firing, so that the ceramic multi-layer boards having highly dimensional accuracy are manufactured.

10 Claims, 11 Drawing Sheets

(a)

(b)

(c)

(a)

(b)

(c)

(a)

(b)

(c)

(a)

(b)

(c)

(a)

(b)

METHOD FOR MANUFACTURING CERAMIC MULTI-LAYERED BOARD

TECHNICAL FIELD

The present invention relates to a method of manufacturing ceramic multi-layer boards to be used as a small component of personal computers and cellular phones.

BACKGROUND ART

A conventional ceramic multi-layer board is disclosed in, e.g., Japanese Patent Application Non-Examined Publication No. H11-220260. FIG. 11 illustrates the ceramic multi-layer board disclosed in the foregoing publication. This board is manufactured by a conventional method of laminating green-sheets.

As shown in FIG. 11(a), conductive patterns 13, 14 are printed on each green sheet 12. Then as shown in FIG. 11(b), respective green sheets 12 are laminated, and undergo a bonding process by heat & pressure to be integrated. The integrated product is then fired. In this conventional method; however, the shrinkage due to debindering and firing occurs in the product shown in FIG. 11(b). This shrinkage occurs in both a thickness direction and an in-plane direction of the multi-layer board. The shrinkage along the in-plane direction, in particular, influences dimensions of the conductive patterns. Dispersion due to this firing shrinkage is approx. 0.2%. To be more specific, when a board is sized 50 mm square, a dimensional accuracy (dispersion) of the conductive patterns falls within a range of ±100 μm.

Under the present circumstances, boards are mounted with components at a higher density, and a bonding pad is required to have a narrower pitch (not more than 150 μm). Thus the conventional method of laminating green-sheets invites short-circuits in the inner conductive patterns, and it is hard to manufacture electronic components of desirable performance by this conventional method.

DISCLOSURE OF INVENTION

A method of manufacturing ceramic multi-layer boards is disclosed. The method including the steps of:

forming a adhesive layer on at least one surface of a ceramic board;

forming conductive patterns on the adhesive layer;

providing green sheet (GS) on top of the conductive patterns by applying heat and pressure;

forming conductive patterns on the GS;

laminating conductive patterns and GS one after another more than once; and firing the laminated ceramic board thus formed and undergone a debindering process.

DETAILED DESCRIPTION OF PREFERRED EMBODIMENTS OF THE INVENTION

Exemplary embodiments of the present invention are demonstrated hereinafter with reference to the accompanying drawings, which are schematic ones and do not show correct dimensional relations between respective elements.

First as shown in FIG. 1(a), form adhesive layer 12 on at least one surface of ceramic board 11, then as shown in FIG. 1(b), form a first layer of conductive pattern 13 on top of adhesive layer 12. Next, as shown in FIG. 1(c), laminate a first layer of ceramic green sheet (GS) 14 on adhesive layer 12 where conductive pattern 13 has been formed, then bond adhesive layer 12 to GS 14 by applying heat and pressure. Further as shown in FIG. 1(d), form conductive pattern 15 on GS 14, and laminate GS 16 on pattern 15 as shown in FIG. 1(e), and apply heat and pressure thereto. Repeat forming a conductive pattern and a GS in a similar way to what discussed above, then provide the product formed hitherto with debindering and firing processes as shown in FIG. 1(f).

The foregoing manufacturing method includes the step of forming adhesive layer 12, which binds conductive pattern 13 and GS 14 on ceramic board 11 in order to increase dimensional accuracy of conductive pattern 13. Thus GS 14 is restrained from being shrunk due to the firing in the in-plane direction. As a result, GS 14 can be bonded well to ceramic board 11 after the first layer of GS 14 is fired.

Figure 1:
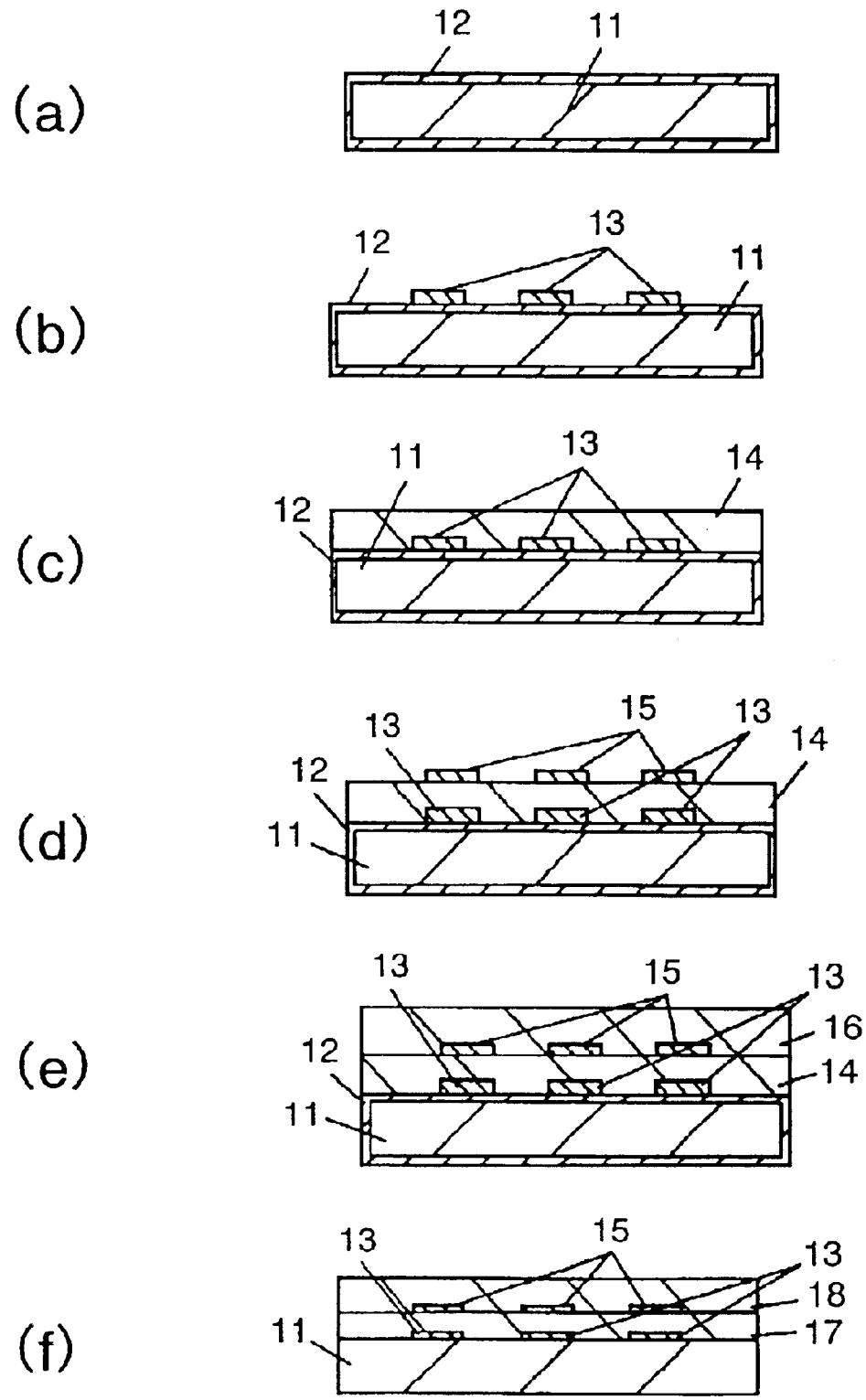
FIG. 1(a) through FIG. 1(f) illustrate the manufacturing processes of ceramic multi-layer boards in accordance with a first exemplary embodiment of the present invention.
Figure 2:
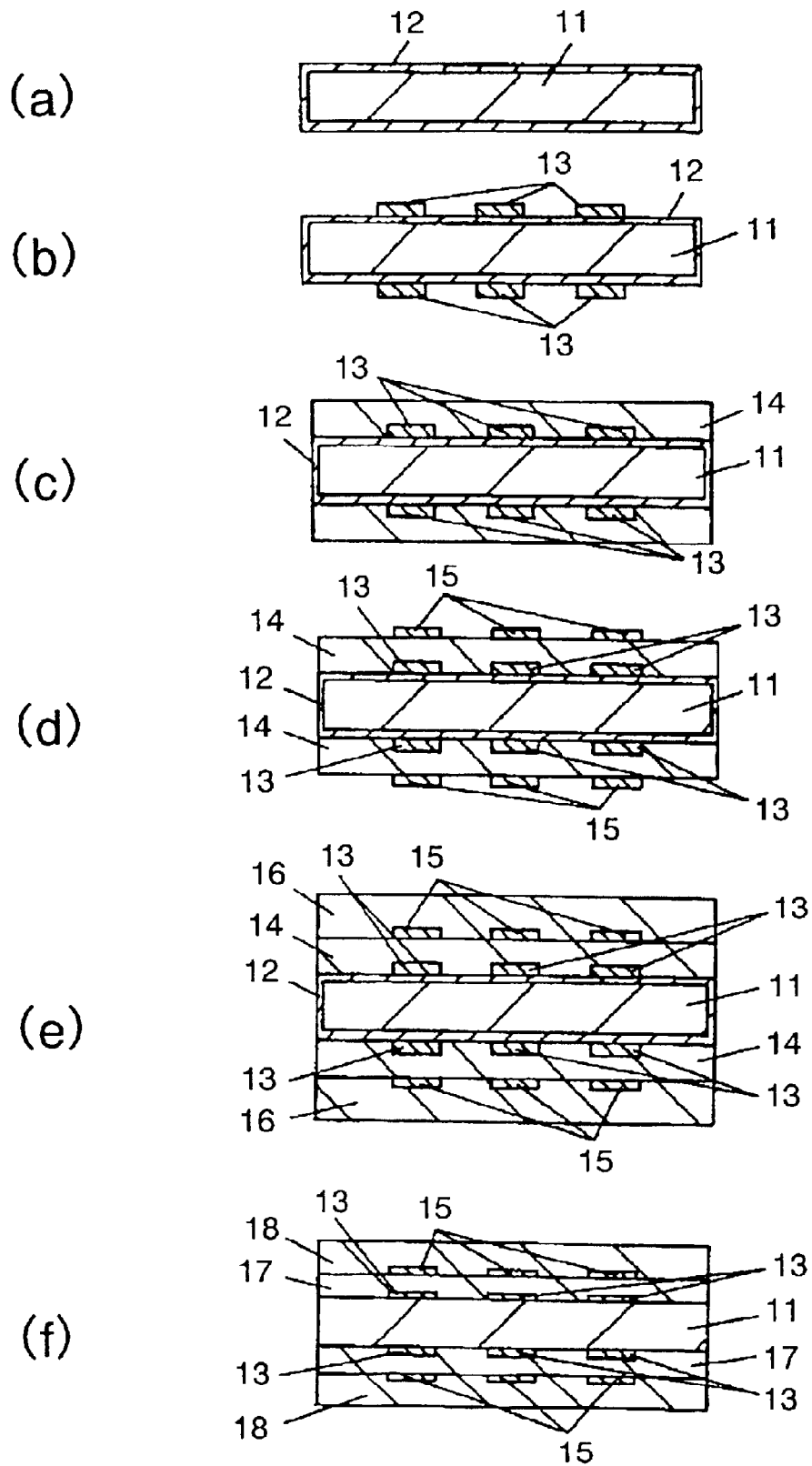
FIG. 2(a) through FIG. 2(f) illustrate the manufacturing processes of ceramic multi-layer boards, of which both the surfaces are laminated with ceramic, in accordance with an exemplary embodiment of the present invention.

The foregoing method is not limited to the case shown in FIG. 1, i.e., adhesive layer 12 is formed at least one surface of the board, and conductive pattern 13 and GS 14 are laminated on the one surface. The method is also applicable to the case where conductive pattern 13 and GS 14 are laminated on both the surfaces.

Hereinafter described are materials that form the respective elements discussed above and devices used in the manufacturing steps. Ceramic board 11 includes a substrates made from alumina, glass ceramic, forsterite, or ferrite. Those ceramic materials have a heat-resistant temperature higher than the sintering temperature of GS 14.

Adhesive layer 12 is made from resin such as butyral resin, acrylic resin, and cycloaliphatic saturated hydrocarbon resin. Those resin materials have heat characteristic that is not higher than a heat distortion temperature of organic binder resin, namely, an ingredient of GS 14. One of those resin materials is dissolved in organic solvent such as toluene or acetone. The solution is applied on at least one surface of ceramic board 11 by dipping or spraying, or using an applying tool such as a roll coater, a sprayer, or a spinner, so that adhesive layer 12 is formed. Layer 12 can be formed on the entire surfaces of ceramic board 11.

Conductive pattern 13 is made from not only noble-metal paste such as Ag-based paste (Ag—Pd paste or Ag—Pt paste both being used for air-firing process), Au-based paste (Au—Pd paste or Au—Pt paste both being used for air-firing process), but also from base metal (e.g. Cu) paste. Conductive pattern 13 is formed on adhesive layer 12 or GS 14 by the screen printing method. In the case of using the base-metal paste, conductive pattern 13 is desirably fired in nitrogen atmosphere or reducing atmosphere.

GS 14 is made from glass ceramic in which butyral resin or acrylic resin is used as organic binder.

Heat and pressure are applied with a hot press formed of an upper metal plate and a lower metal plate each of which is equipped with shock absorbing rubber having a thickness ranging from 0.5 to 4 mm. This device can apply heat and pressure uniformly on the ceramic multi-layer board, thereby preventing the board from cracks.

An operation of an embodiment has been described as above with reference to FIG. 1, and respective structural elements are described more specifically hereinafter.

Exemplary Embodiment 1

In the first embodiment, an alumina board is used as ceramic board 11. If there is a great difference in thermal expansion coefficient between green sheet (GS) 14 and board 11, board 11 bends after the firing of a multi-layer board which includes GS 14 and GS 16 laminated on board 11. Those materials thus preferably have small differences in thermal expansion coefficient from each other. In fact, the first embodiment uses alumina powder and glass powder as material powder so that board 11 can have anorthite crystal after the firing.

Acrylic resin is used as organic binder, which is kneaded into slurry, and this slurry is applied by the doctor blade treatment, thereby forming the GS. Butyral resin or acrylic resin is used as resin material in organic vehicle of GS 14 and GS 16, of which thickness ranges from 50 to 400 $\mu$m.

Acrylic resin is dissolved in organic solvent such as toluene, acetone, ethyl acetate, or xylene. This solution is used as material of adhesive layer 12. Ag-paste is used as material of conductive paste 13 and 15.

A method of manufacturing ceramic multi-layer boards is demonstrated hereinafter. First, as shown in FIG. 1(*a*), adhesive layer 12 is formed on at least one surface of ceramic board 11 by dipping or spraying, or using an applying tool such as a roll coater, a sprayer, or a spinner, so that adhesive layer 12 is formed. A thickness of this layer ranges from not less than 1 $\mu$m to less than 10 $\mu$m.

Then as shown in FIG. 1(*b*), a first layer of conductive pattern 13 is formed using Ag-paste on adhesive layer 12 by the screen printing method. A thickness of the conductive pattern is 10–20% that of GS 14 or GS 16.

Next, a first layer of GS 14 is laminated, as shown in FIG. 1(*c*), on adhesive layer 12 where conductive pattern 13 has been formed, and heat and pressure are applied, so that GS 14 is bonded to adhesive layer 12. Heat and pressure are applied with metal plates equipped with shock-absorbing rubber under the following conditions: heat condition: 50–100° C., pressure condition: 50–100 kg/cm2, heat and pressing time: 2–5 minutes. The heat and pressing time is set responsive to thermal conduction of the laminated product through the hot press, metal plates, shock-absorbing rubber.

Then conductive pattern 15 is formed using Ag-paste on top of GS 14, as shown in FIG. 1(*d*), by the screen printing method. Next, GS 16 is laminated on conductive pattern 15 as shown in FIG. 1(*e*) before heat and pressure are applied with the metal plate equipped with the shock-absorbing rubber.

Conductive patterns and GSs are formed repeatedly in a similar manner, so that the number of laminations can be increased. The adhesive layer can increase the bonding force between the conductive pattern and the ceramic board and also increase the bonding force between the GS and the ceramic board, so that they are bound to the ceramic board.

After completion of the lamination, the product hitherto formed undergoes the processes of debindering and firing as shown in FIG. 1(*f*).

The debindering is carried out at a temperature ranging from 400 to 500° C., and for 2–4 hours at the maximum temperature, then the firing is carried out at a sintering temperature ranging from 900 to 920° C., and for 10–20 minutes at the maximum temperature. Adhesive layer 12 is burnt out after the debindering and the firing, and GS 14, GS 16, conductive patterns 13 and 15 can be fired with little dimensional changes in the in-plane direction due to shrinkage-restraining effect by adhesive layer 12 against firing. However, they still shrink in the thickness direction.

The manufacturing method of the first embodiment thus can manufacture the ceramic multi-layer boards having accurate dimensions in the in-plane direction.

Exemplary Embodiment 2

Figure 3:
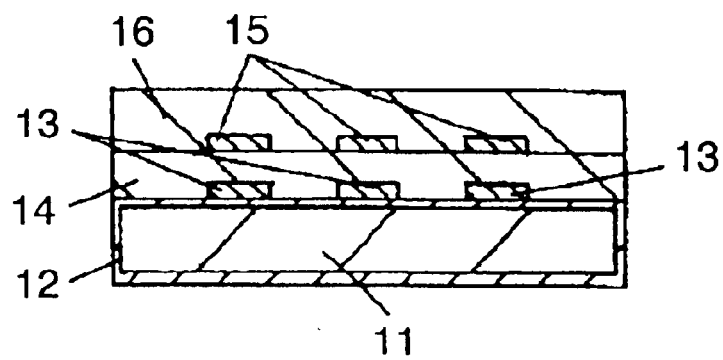
FIG. 3(a) through FIG. 3(c) illustrate statuses of a ceramic multi-layer board before and after a sintering process in accordance with a second exemplary embodiment of the present invention.
Figure 3:
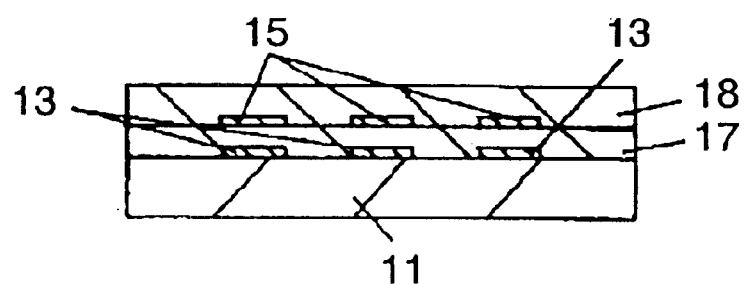
Figure 3:
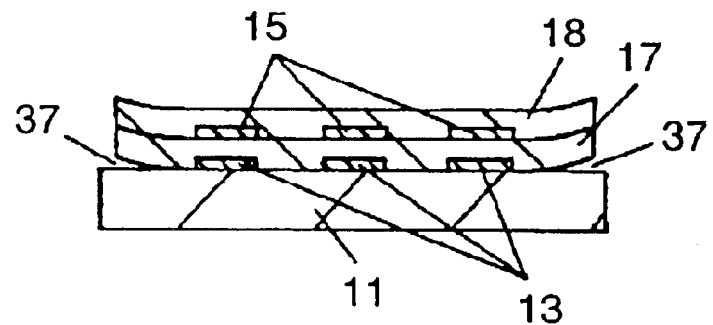

Status of a ceramic board and a green sheet (GS) bonded together by a adhesive layer is described with reference to FIGS. 3, 4, and tables 1, 4. First, a GS is laminated on the adhesive layer formed on a surface of the ceramic board. FIG. 3 monitors how this product changes, after it is fired, depending on the material of GS, the material of the adhesive layer, and heating condition.

FIG. 3(*a*) shows the status of the first embodiment shown in FIG. 1(*e*), and FIGS. 3(*b*) and 3(*c*) show the statuses after the product shown in FIG. 3(*a*) is fired. In FIG. 3(*b*), ceramic board 11 is well bonded to sintered sheet 17; however, in FIG. 3(*c*), they are not bonded well and sheet 17 peels off at its border and peeled-off sections 37 are formed.

The resin component of adhesive layer 12 and that of the organic binder of the GS are evaluated together with the heating condition, and table 1 shows the result. An ink permeation test is used for evaluating the bonding status. This test is described hereinafter with reference to FIG. 4.

Figure 4:
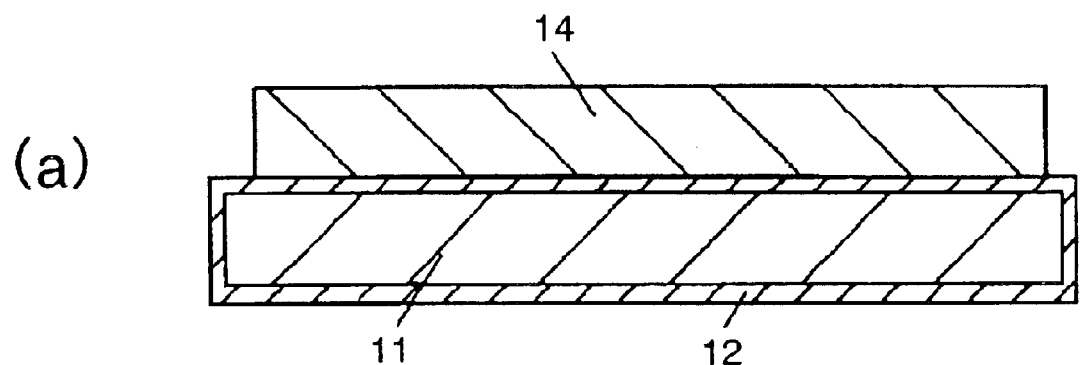
FIG. 4(a) through FIG. 4(c) illustrate processes of ink permeation test.
Figure 4:
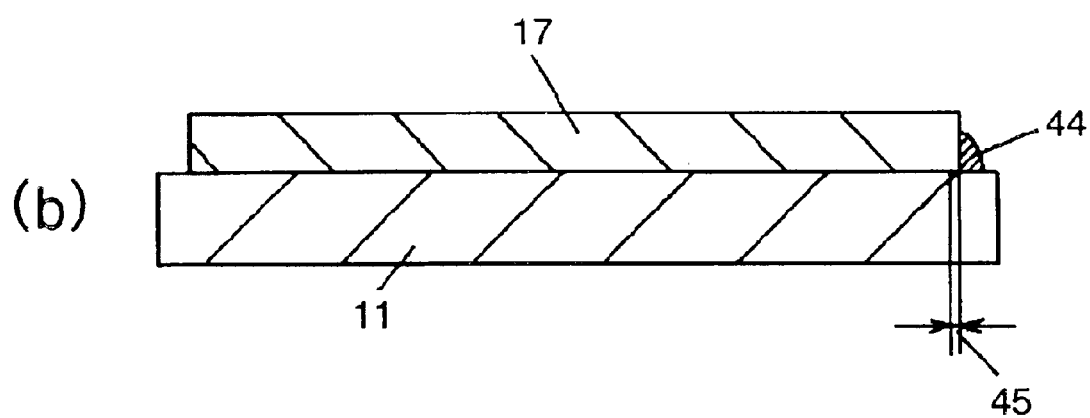
Figure 4:
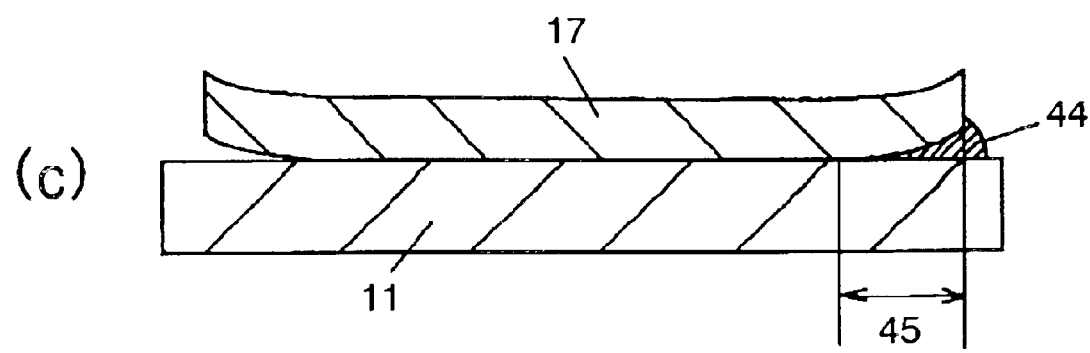

As shown in FIG. 4(*a*), a adhesive layer is formed by dipping or with a roll coater on ceramic board 11 in a thickness ranging from 1 to 2 $\mu$m, and GS 14 is laminated and bonded on top of that with a hot press.

FIGS. 4(*b*) and 4(*c*) show the status where the product shown in FIG. 4(*a*) is fired. FIG. 4(*b*) shows that sintered sheet 17 is well bonded to board 11, and almost no ink 44 supplied from the border of sheet 17 permeates through gaps. However, as shown in FIG. 4(*c*), poor bonding between board 11 and sheet 17 allows the ink supplied from the border of sheet 17 to permeate through the gap.

In other words, a comparison of ink-permeating distances 45 can evaluate the bonding status. The following combinations of materials are evaluated, and the result is shown in table 1:

Organic binder resin of GS 14: one of butyral resin, or acrylic resin

Resin of adhesive layer 12: one of butyral resin, acrylic resin, or cycloaliphatic saturated hydrocarbon resin.

The result proves that when butyral resin is used as adhesive layer 12, excellent bonding status is obtained at a temperature not lower than 110° C. When acrylic resin or cycloaliphatic saturated hydrocarbon resin is used as adhesive layer 12, excellent bonding status is obtained at a temperature not lower than 80° C. The product having the ink permeating distance ranging from 1 to 2 mm is usable, and the distance not more than 1 mm is preferable.

Table 2 shows heat-distortion temperatures of respective resin materials used in the foregoing evaluation. Comparison of table 1 with table 2 finds a correlation between the heat-distortion temperatures and the heating temperatures of the well bonding status.

TABLE 1

| | | Resin materials of adhesive layer | | |
|---|---|---|---|---|
| Heating temperature | Organic binder of GS | butyral resin | acrylic resin | cycloaliphatic saturated hydrocarbon resin |
| 50° C. | butyral resin | peel off | 1–2 mm | 1–2 mm |
| | acrylic resin | peel off | 1–2 mm | 1–2 mm |
| 80° C. | butyral resin | 20–30 mm | not more than 1 mm | not more than 1 mm |
| | acrylic resin | 15–20 mm | not more than 1 mm | not more than 1 mm |
| 110° C. | butyral resin | 1–2 mm | not more than 1 mm | not more than 1 mm |
| | acrylic resin | 1–2 mm | not more than 1 mm | not more than 1 mm | size of ceramic board and GS: 100 mm × 100 mm
thickness of GS: 400 μm, thickness of adhesive layer: 1–2 μm
pressing condition: 150 kg/cm2, 5 minutes

TABLE 2

| resin material | heat distortion temperature (° C.) |
|---|---|
| butyral resin | 110–160 |
| acrylic resin | 70–100 |
| cycloaliphatic saturated-hydrocarbon resin | 70–100 |

In other words, a heating temperature of adhesive layer 12 not higher than the heat distortion temperature of the organic binder resin and not lower than the heat distortion temperature of adhesive layer 12 assures well bonding status. It is more preferable if the resin material of adhesive layer 12 and that of GS 14 are miscible with each other.

Exemplary Embodiment 3

Figure 5:
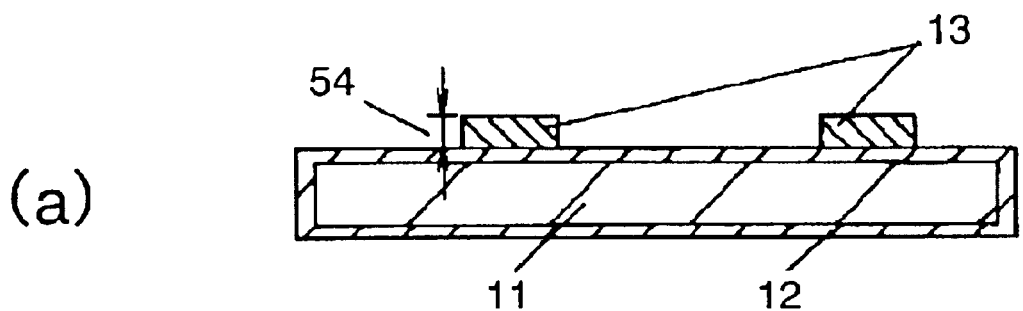
FIG. 5(a) through FIG. 5(c) illustrate a proper thickness range of an inner conductive pattern.
Figure 5:
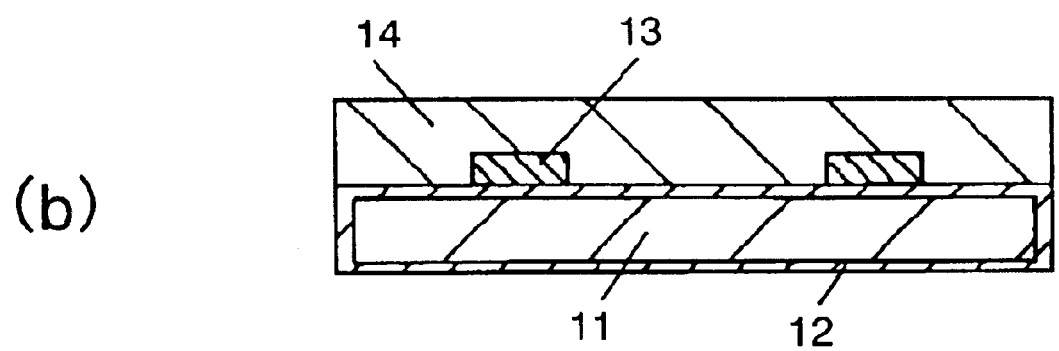
Figure 5:
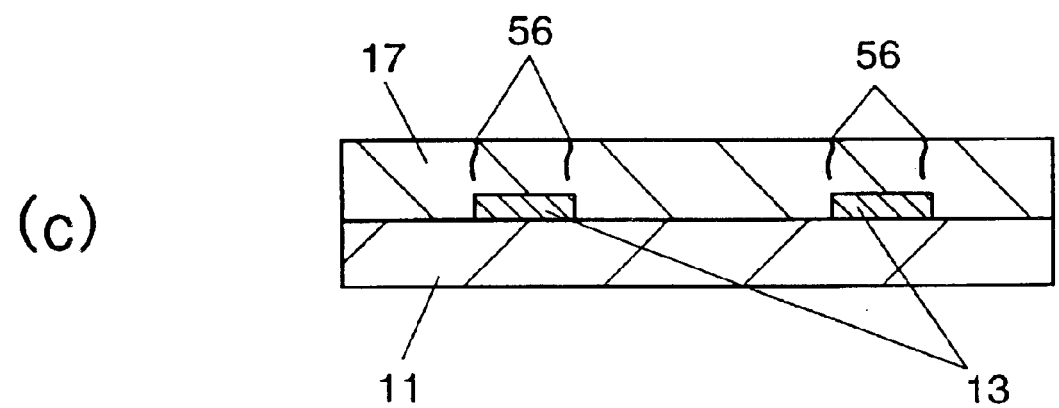

A proper thickness range of inner conductive patterns is described with reference to FIGS. 5 and 6. FIG. 5(a) shows the status where adhesive layer 12 is formed on ceramic board 11, and conductive pattern 13 is formed using conductive paste on top of layer 12 by the screen printing method. The thickness of conductive pattern 13 is indicated with reference mark 54. FIG. 5(b) shows the status where green sheet (GS) 14 is formed on the product shown in FIG. 5(a) by applying heat and pressure. FIG. 5(c) shows the status where the laminated product shown in FIG. 5(b) is debindered and fired. After the firing, cracks 56 sometimes occur in sintered sheet 17 around the border of conductive pattern 13 when thickness 54 of pattern 13 is more than necessary.

Figure 6:
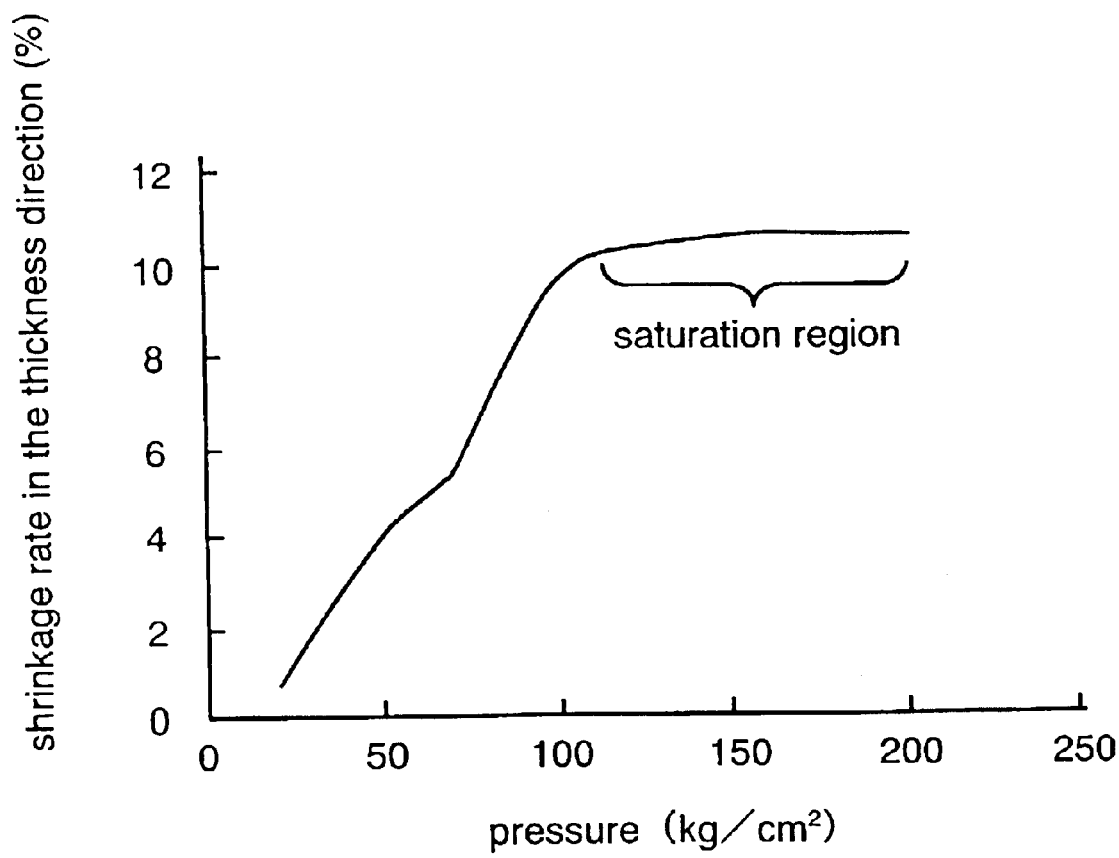
FIG. 6 illustrates a relation between a pressure applied and a shrinkage rate of green sheet (GS).

FIG. 6 shows shrinkage rates of GS 14 in the thickness direction due to heating and pressing. As shown in FIG. 6, GS 14 shrinks at a greater rate proportionate to greater pressure applied; however, the shrinkage rate is almost saturated at the pressure of 100 kg/cm2 or more.

A pressure-shrinkage saturation rate with respect to the thickness of GS 14 is approx. 10%, in general. In the case of GS 14 having a thickness of 100 μm, GS 14 shrinks by approx. 10 μm.

In this third embodiment, the same materials are used as the first embodiment, and if GS 14 has a thickness of 100 μm and thickness 54 of conductive pattern 13 is set at not less than 10 μm, the cracks occur.

As such, when conductive pattern 13 is formed, if thickness 54 thereof exceeds the pressure-shrinkage amount in the thickness direction of GS 14, shrinking stress concentrates on conductive pattern 13, so that the pressure is not applied to laminated GS 14 at the border of pattern 13. Thus GS 14 is not bonded well to ceramic board 11, and cracks sometimes occur at the poor bonded sections after the firing.

Therefore, thickness 54 of conductive pattern 13 is set at not more than the pressure-shrinkage saturating amount of GS 14 in the thickness direction, so that the stress generated in board 11 can be dispersed. As a result, the cracks in GS 14 at the border of pattern 13 can be prevented. When an interval between conductive pattern 13 and an adjacent pattern is not more than 100 μm, the thickness of conductive pattern 13 is set at not more than 10% that of the GS, so that no cracks occur. If the thickness is set at 20% that of the GS, possibility of cracks rises to approx. 30%. When the interval between pattern 13 and the adjacent pattern is not less than 150 μm, no cracks occur even if the thickness of the conductive pattern is set at 20% that of the GS.

Exemplary Embodiment 4

The conditions of applying heat and pressure to a green sheet (GS) just before firing is described with reference to FIG. 6 and table 3. The ink permeation test carried out in the second embodiment is used again in this fourth embodiment. The heating condition in the experiment is 40–110° C., and pressing condition is 50–200 kg/cm2. Acrylic resin is used as both of organic binder of the GS and a adhesive layer. The experiment result is shown in table 3. As table 3 shows, ink permeating distance is advantageously not more than 1 mm under the following conditions:

temperature=not less than 70° C. that is the heat distortion temperature of the acrylic resin, and pressure=100 kg/cm2.

The result tells that the GS is heated up to a temperature higher than the heat distortion temperature of the respective resin materials of adhesive layer 12 and the organic binder of GS 14, so that both the resin materials are miscible with each other and excellent bonding status is obtainable. Further the GS is desirably heated up to a temperature lower than boiling points of respective ingredients (resin, solvent, and additive such as plasticizer) of adhesive layer 12 as well as respective ingredients (resin, solvent, dispersant, and additive such as plasticizer) of organic vehicle of GS 14.

In this embodiment, toluene is used as solvent of adhesive layer 12 and GS 14. Thus when the temperature exceeds 110° C. that is the boiling point of toluene, the laminated product formed hitherto generates volatile gas in the heat & pressure process.

TABLE 3

| Heating | pressing (kg/cm2) | | | | |
|---|---|---|---|---|---|
| (° C.) | 50 | 70 | 100 | 150 | 200 |
| 40 | 30–40 | 20–30 | 15–20 | 15–20 | 15–20 |
| 50 | 15–20 | 3–4 | 2–3 | 1–2 | 1–2 |

TABLE 3-continued

| Heating (° C.) | pressing (kg/cm2) | | | | |
|---|---|---|---|---|---|
| | 50 | 70 | 100 | 150 | 200 |
| 70 | 10–15 | 2–3 | not more than 1 mm | not more than 1 mm | not more than 1 mm |
| 80 | 5–10 | 2–3 | not more than 1 mm | not more than 1 mm | not more than 1 mm |
| 110 | 5–10 | 1–2 | not more than 1 mm | not more than 1 mm | not more than 1 mm | adhesive layer: acrylic resin, thickness of adhesive layer: 1–2 μm
size of GS: 100 mm X 100 mm, thickness of GS: 400 μm,
size of ceramic board: 100 mm x 100 mm,
heating and pressing time: 3–5 minutes If this volatile gas remains in GS 14, the gas causes cracks in a sintered sheet when GS 14 is sintered. Thus GS 14 is desirably heated up not higher than 110° C.

As shown in FIG. 6, a shrinkage rate due to pressing is saturated at 100 kg/cm2 and more. In other words, when the pressure exceeds 100 kg/cm2, the density of GS 14 is saturated, and restraint on shrinkage due to firing reaches the ceiling.

Based on the foregoing discussion, it can be concluded that GS 14 has the following optimum heating and pressing conditions just before firing:

heating condition: a temperature not lower than the heat distortion temperature of the resin materials of adhesive layer 12 and the organic binder of the GS, and yet not higher than the boiling points of the ingredients of the adhesive layer and the organic vehicle of the GS;

pressing condition: a pressure falling within the saturation region of pressure-shrinkage rate in the thickness direction of GS 14.

Exemplary Embodiment 5

Figure 7:
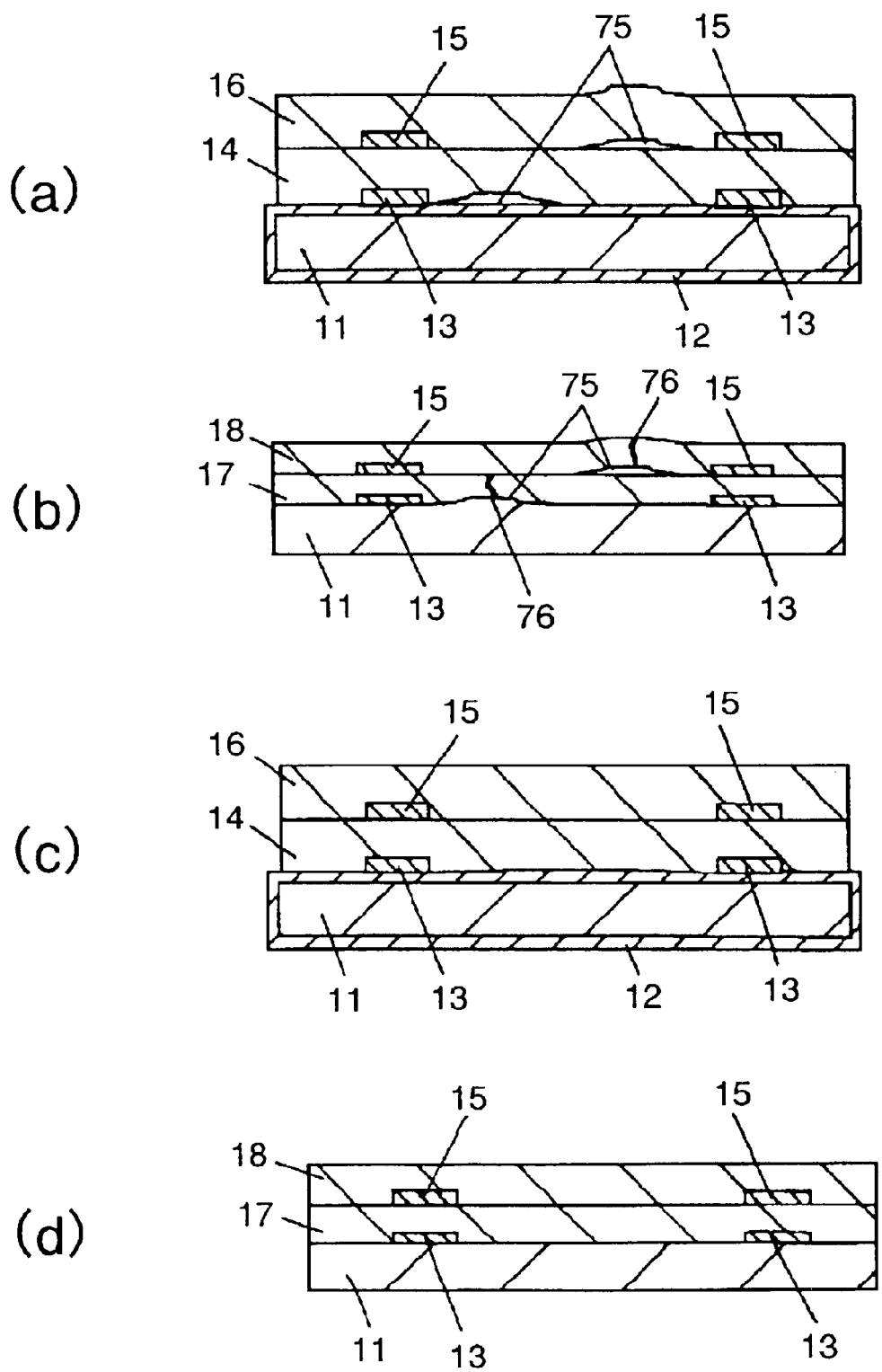
FIG. 7(a) through FIG. 7(d) illustrate conditions of the heating process that is carried out before a heat & pressure process just before a debindering process.

A condition of a heating process is described hereinafter with reference to FIGS. 6 and 7. The heating process is carried out before a heating and pressing process just before a debindering process. FIGS. 7(*a*) and 7(*b*) show the same status as shown in FIG. 1(*e*), namely, adhesive layer 12 is formed on ceramic board 11, and conductive patterns 13 and green sheet (GS) 14 are laminated by heating on top of that.

FIG. 7(*a*) shows the status where heat is applied to increase a temperature higher than the heat distortion temperature or the softening point of the organic binder resin of GS 14. As shown in FIG. 7(*a*), residual air 75 is generated in GS 14 laminated, because ingredients of the organic binder of GS 14 can be softened and fluidized as well as adhesive property of the contacting faces of adhesive layer 12 and GS 14 can be increased. Residual air 75 occurs as blistering phenomenon just after heating and pressing; however, the blister apparently vanishes after cooling.

However, as shown in FIG. 7(*b*), after the product shown in FIG. 7(*a*) is debindered and fired, residual air 75 causes cracks 76 at poorly bonded sections. Thus it is necessary to prepare the heating condition such that no residual air 75 remains within a temperature range not exceeding the heat distortion temperature of the organic binder resin of GS 14.

FIG. 7(*c*) shows the status where the product is heated in the heating process, before the heating and pressing process that is to be carried out just before the debindering, to a temperature not exceeding the heat distortion temperature of the organic binder resin of GS 14. As shown in FIG. 7(*c*), residual air 75 existing in FIG. 7(*a*) cannot be seen any more. FIG. 7(*d*) shows the status of product in FIG. 7(*c*) undergone the processes of debindering and firing, and it shows that the product is in excellent status free from residual air 75.

The foregoing discussion proves that the optimum condition of the heating, to be carried out before the heating and pressing process just before the debindering process, is that the product can be heated up to the temperature not exceeding the heat distortion temperature of the organic binder resin of GS 14.

The optimum pressing condition includes a pressure which does not cause peel-off between adjacent GSs until the final pressing process, and yet the pressure is low enough for the shrinkage amount in the thickness direction of GS 14 not to be saturated. The pressure also falls within a range that can absorb unevenness in the thickness direction of conductive patterns 13.

Those conditions permit respective GSs 14 laminated to have allowance to be shrunk in the thickness direction and to be pressed and shrunk uniformly in the thickness direction in the final heat & pressure process. Thus dispersion in in-plane-thickness due to the unevenness in conductive pattern 13 can be absorbed with ease. In this fifth embodiment, the optimum heat and pressing conditions in laminating GS 14 (until the final heat and pressure process) are 50–70° C. (not exceeding 80° C.) and 50–100 kg/cm2 (a pressure within this range the pressure-shrinkage rate is not saturated in the thickness direction of GS 14).

Exemplary Embodiment 6

In the heating process to be carried out before the heat and pressure process just before the debindering process in the fifth embodiment, if the heating process is carried out in the atmospheric pressure, the heat condition that firmly bonds ceramic board 11 to GS 14 via adhesive layer 12 needs to be a temperature not lower than the heat distortion temperature of the organic binder of GS 14. Thus air remained in the laminated product is trapped there when GS 14 is laminated due to theme-pressing, and the air becomes blister after the pressing.

To overcome this phenomenon, the laminated product is put into the status of 1–5 Torr vacuum degree before it is heated and pressed using a vacuum hot press. As a result, no blister exist in the laminated product after the application of heat and pressure, and no cracks due to residual air 75 are seen after the firing. A well laminated product is thus obtainable. A use of the vacuum hot produces an advantage similar to that of the fifth embodiment.

Exemplary Embodiment 7

Optimum conditions about the sizes of ceramic board 11 and GS 14 are described with reference to FIG. 8, which illustrates how the cracks occur in board 11 during the heat & pressure process shown in FIG. 1(*c*)–FIG. 1(*e*) of the first embodiment.

Figure 8:
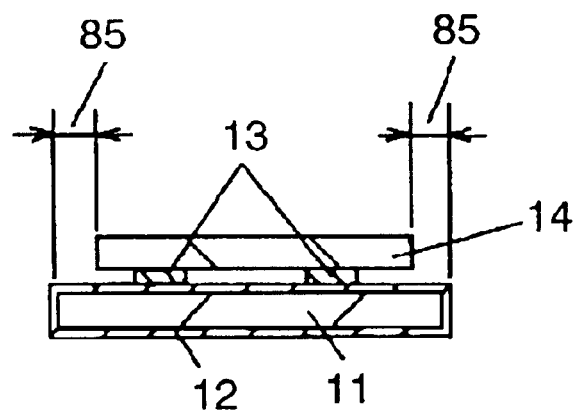
FIG. 8(a) through FIG. 8(c) illustrate an optimum condition between a size of a ceramic board and a size of a GS.
Figure 8:
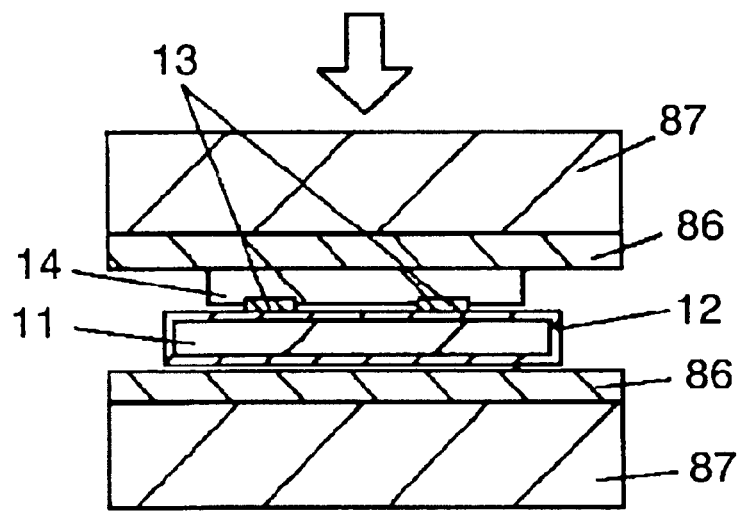
Figure 8:
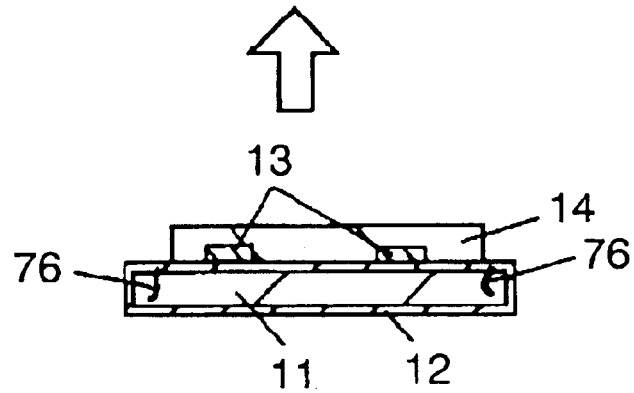

FIG. 8(*a*) illustrates the status where adhesive layer 12 has been formed on ceramic board 11, and conductive patterns 13 have been formed using conductive paste by the screen printing method, then GS 14 smaller than board 11 by distance 85 from the edge of board 11 is just to be laminated.

After that, as shown in FIG. 8(*b*), the laminated product shown in FIG. 8(*a*) is placed between pressing die 87 equipped with shock-absorbing rubber 86, then heated and pressed. When a high pressure is applied, cracks 76 occur in ceramic board 11 as shown in FIG. 8(*c*).

In this seventh embodiment, a forsterite board (flexural strength: 1000 kg/cm2) of 63 mm×52 mm×0.8 mmt is used as ceramic board 11, and GS 14 of which size is smaller than board 11 by distance 85 being not greater than 5 mm is used.

In addition to the foregoing conditions, heat is applied at 80° C. and pressure is applied at 150 kg/cm2 for 5 minutes to the status shown in FIG. 8(*b*), then cracks 76 occur around the border of board 11, where GS 14 is not bonded, through the following processes: First, pressing stress concentrates on the entire surface of GS 14 when thermo-pressing is carried out, and pressure on the border, where no GS 14 exists, of ceramic board 11 substantially reduces, thereby producing difference in stress. Then bending stress occurs at the border, where no GS 14 exists, of board 11 and becomes greater than the flexural strength of board 11. The size of GS 14 is thus desirably approx. the same as board 11 in order to prevent cracks 76. Another way to prevent cracks 76 is to set distance 85 such that the difference between the pressing stress at the bonding section of GS 14 and board 11 and the pressing stress at the exposed board 11 where no GS 14 exist becomes less than the flexural strength of board 11. This set distance 85 includes, not to mention, some allowance.

Exemplary Embodiment 8

A method for improving bonding status of laminated GS 14 after a firing process is described with reference to FIG. 4 and table 4. Glass component that is inorganic element is added to GS 14. Table 4 shows the evaluation, which is done after GS 14 is fired, of bonding status of GS 14 laminated on ceramic board 11. The evaluation is carried out using an amount of amorphous glass in GS 14 as a parameter and the ink permeation test used in the second embodiment. In table 4, "the glass amount in GS 14" indicates a weight % (wt %) of glass component in inorganic materials, and "the amount of amorphous glass after the firing" indicates an amount of amorphous glass excluding crystallized glass after GS 14 is fired.

First, FIG. 4(a) shows the status where GS 14 is bonded with heat and pressure to ceramic board 11 on which adhesive layer 12 has been prepared. This GS 14 is evaluated using, e.g., glass amounts ranging from 45 wt % to 90 wt % as shown in table 4.

TABLE 4

| amount of glass in GS | amount of amorphous glass after firing | ink permeating distance |
| --- | --- | --- |
| 45 wt % | 27 wt % | 3–4 mm |
| 52 wt % | 30 wt % | not more than 1 mm |
| 60 wt % | 37 wt % | not more than 1 mm |
| 90 wt % | 90 wt % | not more than 1 mm | heat & pressure conditions: 50° C., 75 kg/cm2, for 5 minutes
thickness of adhesive layer: 1–2 μm
size of GS: 100 mm × 100 mm, thickness of GS: 400 μm
size of ceramic board: 100 mm × 100 mm FIGS. 4(b) and 4(c) show the bonding status of ceramic board 11, shown in FIG. 4(a) and undergone the firing, to sintered sheet 17. The ink permeation test evaluates the bonding status in a similar way to the second embodiment, and the result is shown in Table 4. When an amount of glass in GS 14 exceeds 52 wt %, namely, when an amount of amorphous glass after the firing increases, the ink permeating distance becomes not more than 1 mm, and ceramic board 11 is well bonded to sintered sheet 17. In other words, increment of the amount of glass in GS 14 improves the bonding status between board 11 and sheet 17. The amount of glass can be increased up to 100 wt %; however, filler component formed of alumina or zirconia is desirably added by not less than 10 wt % if the board strength is taken into consideration. Therefore, the upper limit of the amount of glass is preferably less than 100 wt %, and an excellent result is obtainable at 90 wt %.

Exemplary Embodiment 9

Figure 9:
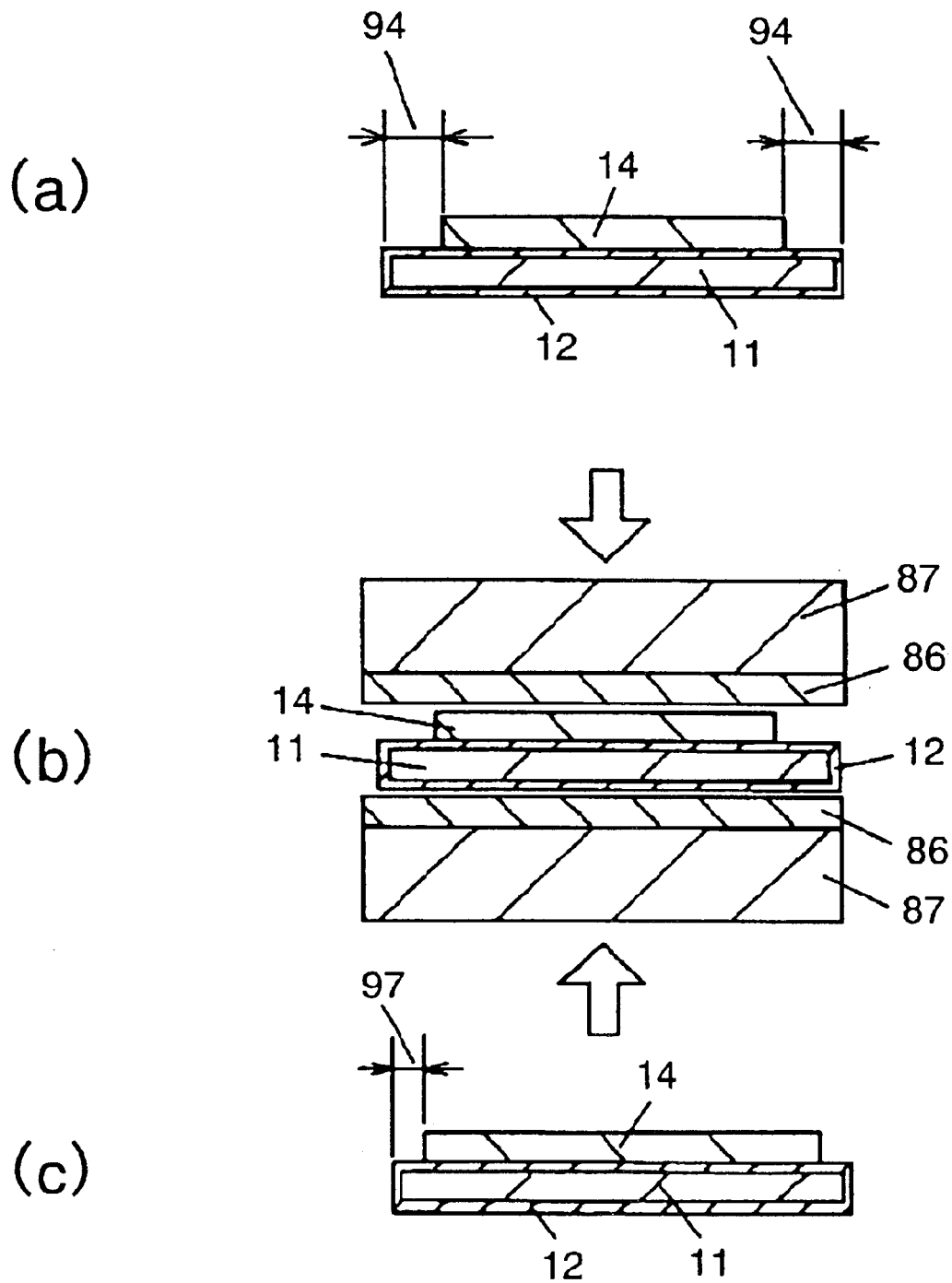
FIG. 9(a) through FIG. 9(c) illustrate adhesive status, depending on surface roughness of the ceramic board, between the ceramic board and the GS after the firing process.

The bonding status, after the firing, of ceramic board 11 and GS 14 depending on the surface roughness of board 11 is described with reference to FIG. 9 and table 5. FIG. 9(a) shows the status where GS 14 is laminated on board 11 on which adhesive layer 12 has been prepared. Distance 94 indicates the distance between an edge of board 11 and an edge of GS 14.

FIG. 9(b) shows the status where the laminated product shown in FIG. 9(a) is placed between pressing die 87 equipped with shock-absorbing rubber 86, and FIG. 9(c) shows the status where heat and pressure are applied to the product shown in FIG. 9(b).

In this ninth embodiment, application of heat at 80° C. and pressure at 150 kg/cm2 are carried out for 5 minutes. Acrylic resin is used as a adhesive layer of which thickness ranges 1–2 μm. Distance 97 shown in FIG. 9(c) indicates a distance between the edge of board 11 and that of GS 14, and a difference between distance 97 and distance 94 shown in FIG. 9(a) indicates an extension amount of GS 14.

When the average surface roughness (Ra) of ceramic board 11 falls within 0.1–1.0 μm, the extension amount of GS 14 is measured as shown in table 5.

TABLE 5

| Ra of ceramic board (μm) | 0.11 | 0.15 | 0.32 | 0.81 |
| --- | --- | --- | --- | --- |
| extension amount of GS after heat & pressure | 100–200 | not more than 50 | not more than 50 | not more than 50 | heat & pressure condition: 80 ° C., 150 kg/cm2, for 5 minutes
thickness of adhesive layer: 1–2 μm
size of GS: 50 mm × 50 mm
thickness of GS: 200 μm
size of ceramic board: 60 mm × 60 mm As shown in this table, Ra of the ceramic board is set at not less than 0.15 μm, so that an accurate dimensional status is obtainable, where the GS extends in a small amount in the in-plane direction at the application of heat & pressure. Because, as "Ra" of the alumina board increases, the bonding strength increases due to anchor effect.

Exemplary Embodiment 10

Figure 10:
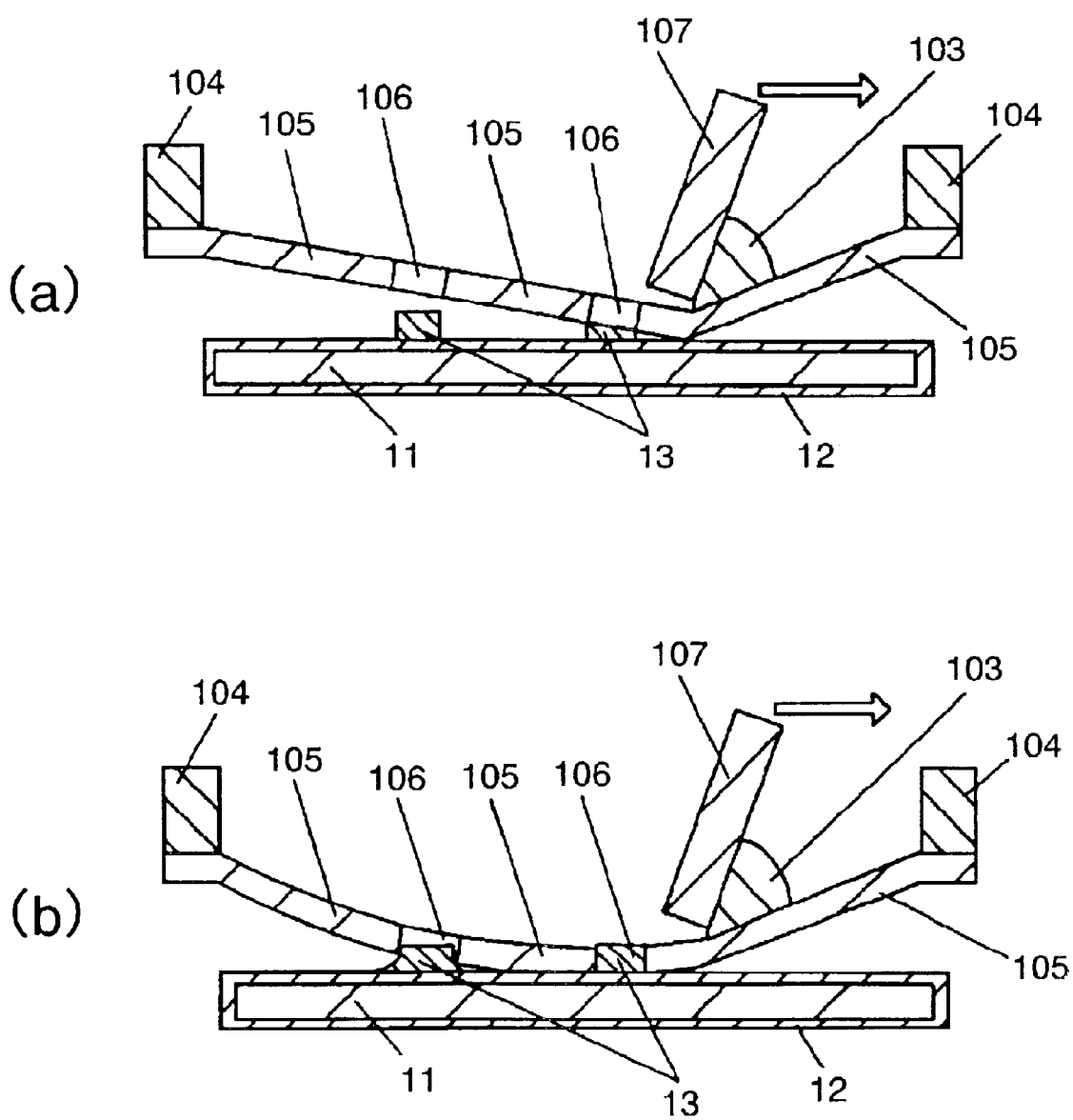
FIGS. 10(a) and 10(b) illustrate a proper thickness range of the adhesive layer when a conductive pattern is formed by a screen printing method.
Figure 11:
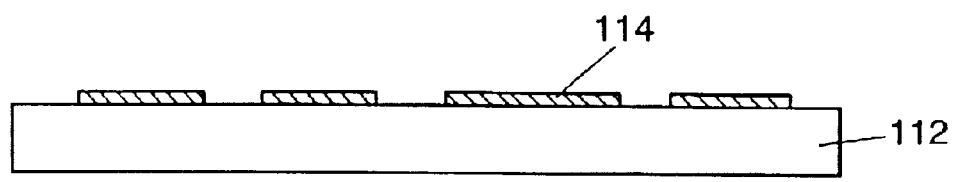
FIGS. 11(a) and 11(b) illustrate processes of a conventional method of laminating green sheets.
Figure 11:
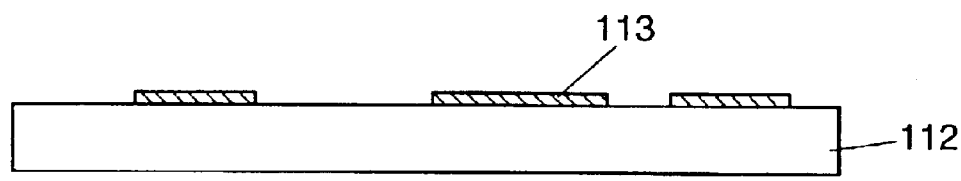
Figure 11:
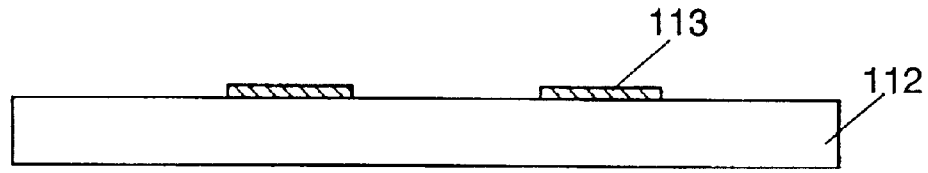
Figure 11:
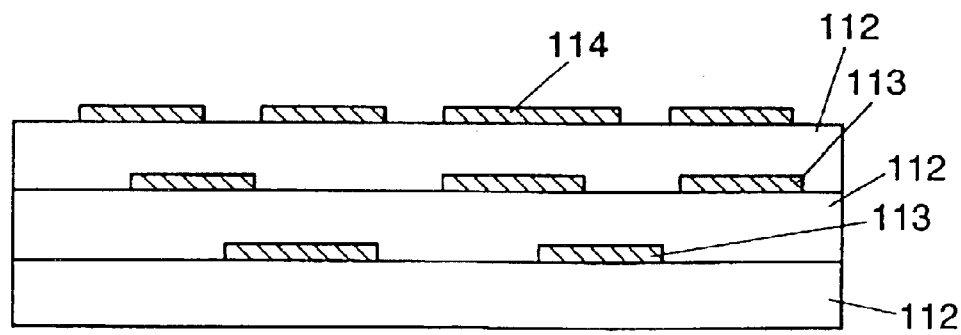

A proper thickness range of a adhesive layer for forming a conductive pattern by the screen printing method is described with reference to FIG. 4, FIG. 10 and table 6.

TABLE 6

| thickness of adhesive | 1–2 | 4–5 | 7–8 | 10–11 |
| --- | --- | --- | --- | --- |
| printing blur on conductive pattern | excellent | excellent | excellent | large blur |
| ink permeating distance mm | not more than 1 | not more than 1 | not more than 1 | 1–2 | print & heat condition: 80° C., 150 kg/cm2, for 5 minutes
size of GS: 100 mm × 100 mm
thickness of GS: 200 μm,
size of ceramic board: 100 mm × 100 mm As shown in FIG. 10(a), conductive patterns 13 are screen-printed, with a screen mask having pattern sections 106, on adhesive layer 12 prepared on ceramic board 11. FIG. 10(b) shows the status where adhesive layer 12 is screen-printed thicker than that shown in FIG. 10(a). As shown in FIG. 10(b), adhesion of adhesive layer 12, which is brought into contact with mask sections 105 of the screen mask at printing, of board 11 increases as adhesive layer 12 becomes thicker. Therefore, pattern-releasing in FIG. 10(b) following the movement of squeege 107 is not so good as that shown in FIG. 10(a), because mask sections 105 delay releasing.

Thus pattern-blur occurs in conductive patterns 13 as shown in FIG. 10(b). An experience is carried out to evaluate the pattern blur by changing the thickness of adhesive layer 12 in the range of 1–11 μm. Table 6 shows the result. As table 6 tells, the thickness not less than 10 μm produces so large pattern-blurs that the conductive patterns 13 are not usable.

Next, adhesive property, after the firing process, of the laminated product formed of ceramic board 11 and GS 14, depending on the thickness of adhesive layer 12 is described hereinafter. The evaluation is carried out using the ink permeation test employed in the second embodiment. As the result shown in table 6 tells, when the thickness of adhesive layer 12 is less than 10 μm, the ink permeating distance becomes not greater than 1 mm, and excellent adhesive property is obtainable. However, when the thickness is less than 1 μm, restraining effect on firing-shrinkage becomes lower. As a result, the ceramic multi-layer boards in excellent status can be obtained when the thickness of adhesive layer 12 falls within the range from not less than 1 μm to less than 10 μm.

Industrial Applicability

A method of manufacturing ceramic multi-layer boards including the steps of: forming a adhesive layer on at least one surface of a ceramic board; forming conductive patterns on top of the adhesive layer; laminating a ceramic green sheet further on the conductive patterns; then applying heat & pressure; forming a conductive pattern on the green sheet; debindering the laminated ceramic board hitherto formed; and finally firing the laminated ceramic board. This method can manufacture the ceramic multi-layer boards of which dimensional accuracy between the conductive patterns is improved.

| List of Reference Marks in the Drawings | |
|---|---|
| 11. | ceramic board |
| 12. | adhesive layer |
| 13, 15. | conductive pattern |
| 14, 16. | ceramic green sheet |
| 17, 18. | sintered sheet |
| 37. | peeled-off section |
| 44. | ink |
| 45. | ink permeating distance |
| 54. | thickness of conductive pattern 13 |
| 56. | crack |
| 75. | residual air |
| 76. | crack |
| 85. | distance |
| 86. | shock-absorbing rubber |
| 87. | pressing die |
| 94, 97. | distance |
| 103. | conductive paste |
| 104. | pattern frame |
| 105. | mask section |
| 106. | pattern section |
| 107. | squeege |
| 112. | green sheet |
| 113, 114. | conductive pattern |

What is claimed is:

1. A method of manufacturing a ceramic multi-layer board, comprising:

providing a ceramic board;

first forming an adhesive layer on at least one surface of the ceramic board;

then second forming a first conductive pattern on the adhesive layer;

then third forming a ceramic green sheet on the first conductive pattern by applying heat and pressure;

then fourth forming a second conductive pattern on the green sheet;

then repeating said third forming and said fourth forming more than once for laminating additional layers each comprising a conductive pattern and a ceramic green sheet form a laminated board; and then debindering and firing the laminated ceramic board for burning out the adhesive layer.

2. The method of claim 1, wherein a heat distortion temperature of resin of the adhesive layer used in said first forming is not higher than a heat distortion temperature of an organic binder resin of said ceramic green sheet.

3. The method of claim 1, wherein a heating temperature in said third forming and in repeating said third forming and fourth forming is lower than respective heat distortion temperatures of resin of the adhesive layer and an organic binder resin of said ceramic green sheet, and pressure applied in said third forming and in repeating said third forming and fourth forming is within a range where a pressure-shrinkage rate of said ceramic green sheet in a thickness direction thereof has not reached a saturated value.

4. The method of claim 1, wherein applications of heat and pressure in said third forming and in repeating said third forming and fourth forming are carried out using one of a hot press equipped with shock-absorbing rubber and a vacuum hot press.

5. The method of claim 1, wherein a thickness of the conductive patterns in said second forming, said fourth forming, and in repeating the third forming and fourth forming is not greater than an amount of pressure-shrinkage of the green ceramic sheet resulting from said applying heat and pressure.

6. The method of claim 1, wherein a heating condition to be carried out immediately before debinding comprising heating to a temperature not lower than heat distortion temperatures of resin material of the adhesive layer formed in the first forming and resin material of an organic binder of the ceramic green sheets formed in said third forming and in repeating the third forming and fourth forming, and yet, not higher than boiling point of ingredients of the adhesive layer and an organic vehicle of the ceramic green sheets, and wherein a pressure condition carried out immediately before debindering and firing the laminated board comprises applying a pressure within a range where a pressure-shrinkage rate of the ceramic green sheet in a thickness direction thereof is at a saturated value.

7. The method of claim 1, wherein the ceramic board used in the first forming is of substantially identical size as the ceramic green sheet formed in said third forming and in repeating the third forming and fourth forming.

8. The method of claim 1, wherein the ceramic green sheets include glass in a range from not less than 52 weight % to less than 100 weight %.

9. The method of claim 1, wherein an average surface roughness (Ra) of the initial ceramic board is not less than 0.15 μm.

10. The method of claim 1, wherein a thickness of the adhesive layer formed in the first forming is within a range from not less than 1 μm to less than 10 μm.

* * * * *